(12) United States Patent
Wakaoka (10) Patent No.: US 11,231,235 B2
(45) Date of Patent: Jan. 25, 2022

(54) VAPOR CHAMBER

(71) Applicant: Murata Manufacturing Co., Ltd., Nagaokakyo (JP)

(72) Inventor: Takuo Wakaoka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 225 days.

(21) Appl. No.: 16/565,931

(22) Filed: Sep. 10, 2019

(65) Prior Publication Data

US 2020/0003501 A1 Jan. 2, 2020

Related U.S. Application Data

(63) Continuation of application No. PCT/JP2018/035670, filed on Sep. 26, 2018.

(30) Foreign Application Priority Data

Sep. 29, 2017 (JP) .............................. JP2017-190724

(51) Int. Cl.
*F28D 15/04* (2006.01)
*F28D 15/02* (2006.01)
(Continued)

(52) U.S. Cl.
CPC ....... *F28D 15/046* (2013.01); *F28D 15/0233* (2013.01); *F28D 15/00* (2013.01); *F28D 2021/0028* (2013.01); *H01L 23/427* (2013.01); *H05K 7/20336* (2013.01); *H05K 7/20436* (2013.01); *H05K 7/20472* (2013.01); *H05K 7/20509* (2013.01)

(58) Field of Classification Search
CPC .... F28D 15/046; F28D 15/0233; F28D 15/00; F28D 15/0225; F28D 2021/0028; H01L 23/427; H05K 7/20509; H05K 7/20336; H05K 7/20436; H05K 7/20472
USPC ........................................ 165/104.26, 104.33
See application file for complete search history.

(56) References Cited

U.S. PATENT DOCUMENTS 9,188,396 B2    11/2015  Kameoka et al.
10,018,427 B2 *  7/2018  Lin .................... H05K 7/20309
(Continued)

FOREIGN PATENT DOCUMENTS

JP      3050180 U       6/1998
JP      2001147084 A    5/2001
(Continued)

OTHER PUBLICATIONS

International Search Report issued in PCT/JP2018/035670, dated Dec. 25, 2018.
(Continued)

*Primary Examiner* — Joel M Attey
(74) *Attorney, Agent, or Firm* — Arent Fox LLP (57) ABSTRACT

A vapor chamber that includes a housing defining an internal space, a first pillar arranged in the internal space of the housing to support the housing from the internal space, a working medium enclosed in the internal space of the housing, and a wick arranged in the internal space of the housing, the wick having a portion of a first main surface thereof supported by the first pillar so as to be spaced from the housing, and a thickness of the wick is partially different along a cross-section thereof.

15 Claims, 8 Drawing Sheets

(51) Int. Cl.
*F28D 21/00* (2006.01)
*H05K 7/20* (2006.01)
*H01L 23/427* (2006.01)
*F28D 15/00* (2006.01)

(56) References Cited

U.S. PATENT DOCUMENTS

| | | | |
|---|---|---|---|
| 10,667,430 B2 * | 5/2020 | Inagaki | H05K 7/20336 |
| 10,731,925 B2 * | 8/2020 | Lewis | F28F 21/085 |
| 10,890,382 B2 * | 1/2021 | Chiang | F28D 15/046 |
| 2002/0189793 A1 | 12/2002 | Noda et al. | |
| 2007/0163755 A1 | 7/2007 | Kim et al. | |
| 2007/0295486 A1 * | 12/2007 | Su | F28D 15/0233 165/104.26 |
| 2010/0157533 A1 | 6/2010 | Oniki et al. | |
| 2012/0118537 A1 | 5/2012 | Kameoka et al. | |
| 2013/0025829 A1 | 1/2013 | Huang | |
| 2013/0037242 A1 | 2/2013 | Chen et al. | |
| 2013/0213612 A1 | 8/2013 | Wu | |
| 2015/0114603 A1 | 4/2015 | Pai | |
| 2015/0114604 A1 | 4/2015 | Pai | |
| 2016/0153723 A1 | 6/2016 | Huang et al. | |
| 2018/0010861 A1 | 1/2018 | Wakaoka et al. | |

FOREIGN PATENT DOCUMENTS

| | | |
|---|---|---|
| JP | 2007519877 A | 7/2007 |
| JP | 2010151353 A | 7/2010 |
| JP | 2011017463 A | 1/2011 |
| JP | 2011043320 A | 3/2011 |
| JP | 2015121373 A | 7/2015 |
| WO | 2016151916 A1 | 9/2016 |
| WO | 2017115772 A1 | 7/2017 |

OTHER PUBLICATIONS

Written Opinion of the International Searching Authority issued in PCT/JP2018/035670, dated Dec. 25, 2018.

* cited by examiner

VAPOR CHAMBER

CROSS REFERENCE TO RELATED APPLICATIONS

The present application is a continuation of International application No. PCT/JP2018/035670, filed Sep. 26, 2018, which claims priority to Japanese Patent Application No. 2017-190724, filed Sep. 29, 2017, the entire contents of each of which are incorporated herein by reference.

FIELD OF THE INVENTION

The present invention relates to a vapor chamber.

BACKGROUND OF THE INVENTION

In recent years, a heat generation amount has increased due to high integration and high performance of heat-generating elements. Further, a heat generation density is increased with size reduction of a product, so that heat radiation dissipation measures have become increasingly important. This situation is particularly prominent in the field of mobile terminals such as smart phones and tablets. In recent years, although a graphite sheet or the like is often used as a heat countermeasure member, the heat transportation amount thereof is not sufficient. Therefore, use of various heat countermeasure members have been investigated. Among them, use of a vapor chamber, which is a planar heat pipe, has been studied as it is possible for the vapor chamber to transport heat very effectively.

The vapor chamber has the configuration in which a working medium and a wick for transporting the working medium by capillary force are enclosed inside a housing. The working medium absorbs heat from a heat generation element in an evaporation portion which absorbs heat from the heat generation element, evaporates in the vapor chamber, moves to a condensation portion, and is cooled to return to be in a liquid phase. The working medium which has returned to be in the liquid phase is moved to the heating generation element side (evaporation portion) again by the capillary force of the wick and cools the heat generation element. By repeating this operation, the vapor chamber can operate autonomously without having external power and can diffuse heat two dimensionally at high speed by utilizing evaporation latent heat and condensation latent heat of the working medium.

As the above-described vapor chamber, for example, a vapor chamber including a sheet-like container, a wick enclosed in the container, and a working medium enclosed in the container has been known (Patent Document 1).

Patent Document 1: International Publication No. 2016/151916

SUMMARY OF THE INVENTION

Figure 18:
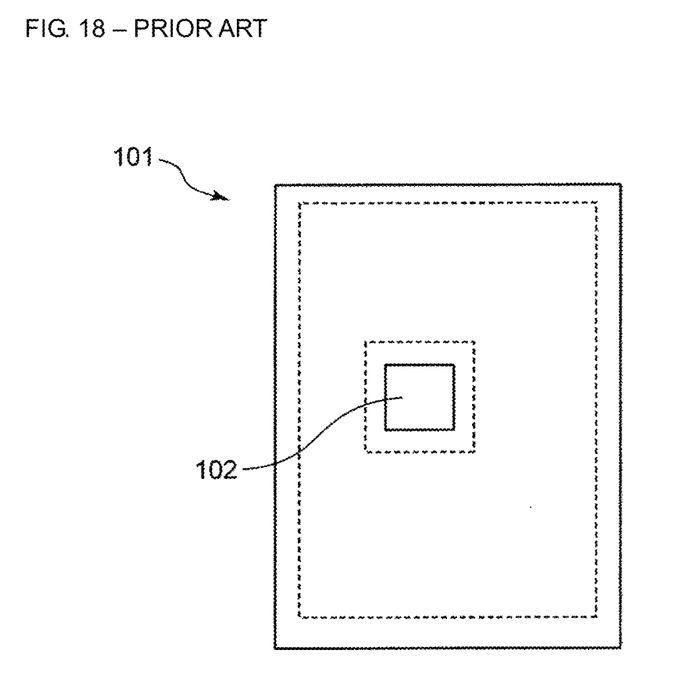
FIG. 18 is a plan view illustrating one mode of an existing vapor chamber.
Figure 19:
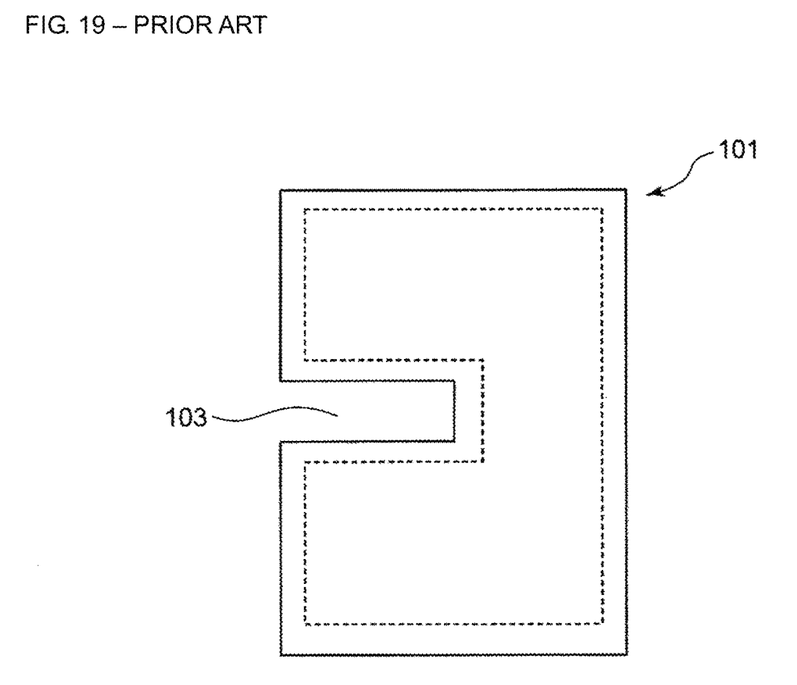
FIG. 19 is a plan view illustrating another mode of an existing vapor chamber.

The vapor chamber as described above may be incorporated into various electronic apparatuses. In this case, other components may be arranged around the vapor chamber. When other components are present around the vapor chamber, a penetration portion 102 or a cutout portion 103 needs to be formed in a vapor chamber 101 in order to avoid interference with the components around the vapor chamber (see FIGS. 18 and 19). However, in the vapor chamber in which the penetration portion or the cutout portion is formed, a narrow portion with a reduced cross-sectional area of an internal space due to the penetration portion or the cutout portion is generated. When the above-described narrow portion is generated, flow of the working medium is interrupted and heat transportation capacity of the vapor chamber is lowered.

Accordingly, it is an object of the present invention to provide a vapor chamber having high heat transportation capacity.

As a result of extensive studies to solve the above-mentioned problem, the inventors of the present invention have found that heat transportation capacity of a vapor chamber can be increased by providing spaces in which a liquid working medium and a gas working medium are respectively moved and increasing capacity of transporting, in particular, the liquid working medium. They have further found that in order to increase the capacity of transporting the liquid working medium, it is effective to arrange a wick in a wide range as much as possible and to increase the thickness thereof, and have achieved the present invention.

According to a first aspect of the invention, there is provided a vapor chamber that includes a housing defining an internal space; a first pillar arranged in the internal space of the housing to support the housing from the internal space; a working medium enclosed in the internal space of the housing; and a wick arranged in the internal space of the housing, the wick having a portion of a first main surface thereof supported by the first pillar so as to be spaced from the housing, and a thickness of the wick is partially different along a cross-section thereof.

According to a second aspect of the invention, there is provided an electronic apparatus including the vapor chamber according to the first aspect of the invention.

According to the present invention, by adjusting the thickness of the wick of the vapor chamber depending on places, heat transportation capacity of the vapor chamber can be increased.

DETAILED DESCRIPTION OF THE PREFERRED EMBODIMENTS

Hereinafter, a vapor chamber of the invention will be described in detail.

First Embodiment

Figure 1:
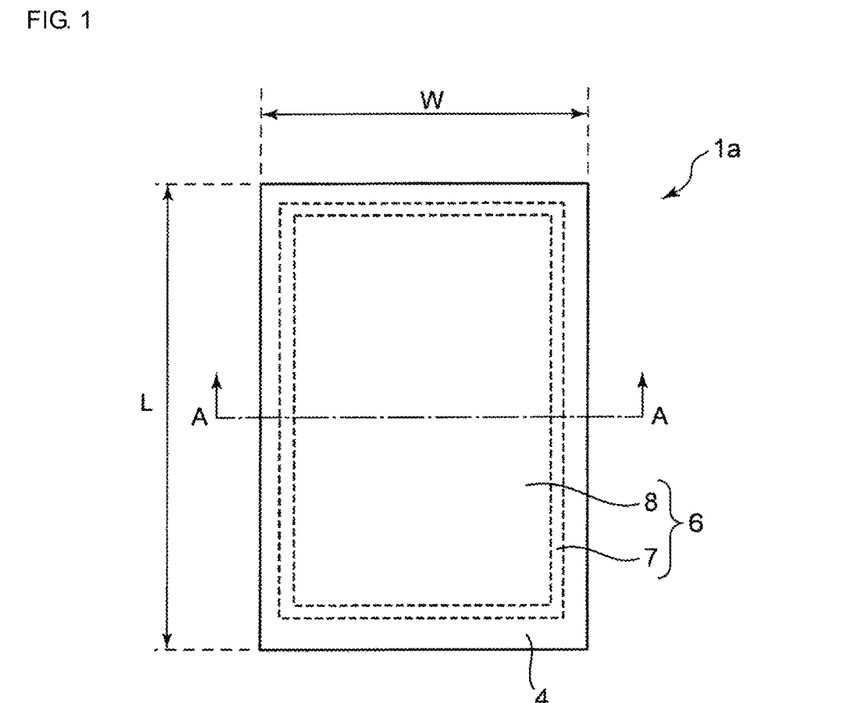
FIG. 1 is a plan view of a vapor chamber 1a in one embodiment of the invention.
Figure 2:
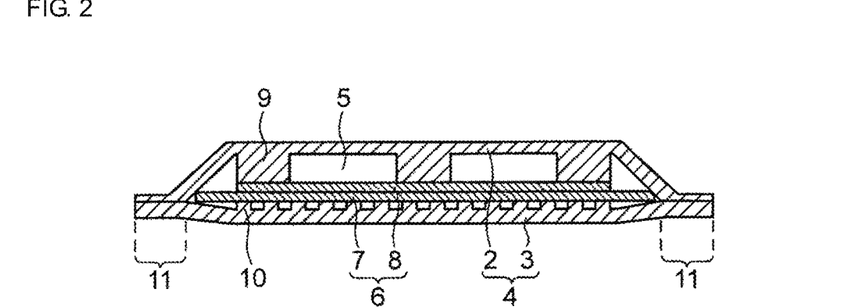
FIG. 2 is a cross-sectional view of the vapor chamber 1a illustrated in FIG. 1 taken along line A-A.

FIG. 1 is a plan view of a vapor chamber 1a in an embodiment, which will be described below, and FIG. 2 is a cross-sectional view thereof taken along line A-A.

As illustrated in FIGS. 1 and 2, the vapor chamber 1a has a housing 4 composed of a first sheet 2 and a second sheet 3, the outer edge portions of which are joined together and which face each other. A wick 6 is arranged in an internal space 5 of the housing 4. In order to maintain the internal space 5 in the housing 4, first pillars 9 are provided between the first sheet 2 and the wick 6 so as to support the first sheet 2 and the second sheet 3 from the inside. Second pillars 10 are provided between the second sheet 3 and the wick 6. The first sheet 2 and the second sheet 3 are brought close to each other in a region outside a region where the first pillars 9 are provided, and are brought into contact with each other, joined together, and sealed at the outer edge portions thereof. A portion in which the first sheet 2 and the second sheet 3 are joined together is also referred to as a "joint portion" hereinafter. In other words, the first sheet 2 and the second sheet 3 are typically brought close to each other from edges of the first pillars 9 closest to edges of the sheets and are joined together and sealed at a joint portion 11 located at the outer edge portions of the sheets. The vapor chamber 1a includes a working medium (not illustrated) enclosed in the internal space 5 of the housing 4.

The wick 6 is composed of a first mesh 7 and a second mesh 8. The first mesh 7 and the second mesh 8 are different in size from each other in a plan view of the vapor chamber. In the first embodiment, the first mesh 7 is larger than the second mesh 8. While the first mesh 7 and the second mesh 8 overlap with each other to form the wick 6, the first mesh 7 and the second mesh 8 are different in size from each other, so that the thickness of the wick 6 is partially different along a cross-section thereof. That is, the wick 6 is composed only of the first mesh 7 and is relatively thin in a portion along the joint portion 11 as an outer edge portion of the housing 4, and is composed of both the first mesh 7 and the second mesh 8 and is relatively thick in an inner portion thereof. Since the thin portion composed only of the first mesh 7 can be arranged to be closer to the outer edge portion, the first mesh 7 can be arranged in a wider area. Capacity of transporting a liquid working medium with capillary force of the wick 6 can thereby be obtained also in the vicinity of the outer edge portion. Since the thick portion composed of both the first mesh 7 and the second mesh 8 has a larger cross-sectional area of the wick 6, larger capillary force is obtained and the capacity of transporting the liquid working medium is increased. The wick 6 is supported by the first pillars 9 and is spaced apart from the first sheet 2 in a large part thereof. A space between the first sheet 2 and the wick 6 can function as a vapor passage through which a gas working medium moves. This function provides capacity of transporting the larger amount of the gas working medium. With such a structure, the vapor chamber 1a has excellent heat transportation capacity as a whole.

In the vapor chamber of the invention, since the thickness of the wick is partially different along a cross-section thereof as described above and the thickness thereof can be varied depending on installation places of the wick, the transportation capacity for the liquid working medium can be further increased. For example, the cross-sectional area of the wick can be increased by increasing the thickness of the wick and arranging the wick in a place with the smallest thickness of the internal space 5 to increase an installation area by reducing the thickness of the wick, thereby further increasing the transportation capacity for the liquid working medium.

Further, since at least a part of one main surface (surface on the first sheet side, i.e., the upper surface in FIG. 2) of the wick has a portion supported by the first pillars and spaced from the housing, the passage of the gas working medium is ensured. Therefore, the transportation capacity for the gas working medium can be further increased.

As described above, the vapor chamber 1a of the invention may have a large heat transportation amount as a whole because it can increase the transport capacity for both of the liquid working medium and the gas working medium.

The vapor chamber 1a has a planar shape as a whole. That is, the housing 4 has a planar shape as a whole. Here, the term "planar shape" includes a plate shape and a sheet shape and means a shape having a considerably large length and width relative to a height (thickness), for example, a shape having a length and width of equal to or more than 10 times, preferably equal to or more than 100 times larger than the thickness.

The size of the vapor chamber 1a, that is, the size of the housing 4 is not particularly limited. The length (denoted by a reference numeral L in FIG. 1) and the width (denoted by a reference numeral W in FIG. 1) of the vapor chamber 1a can be appropriately set depending on applications and may be, for example, 5 mm to 500 mm, preferably 20 mm to 300 mm, and most preferably 50 mm to 200 mm.

Materials forming the first sheet 2 and the second sheet 3 are not particularly limited as long as they have characteristics suitable for use as a vapor chamber, for example, they have thermal conductivity, strength, softness, flexibility, and the like. The materials forming the first sheet 2 and the second sheet 3 are preferably metal. The materials may be, for example, copper, nickel, aluminum, magnesium, titanium, iron, or an alloy containing any of them as a main component thereof, and particularly preferably copper. Although the materials forming the first sheet 2 and the second sheet 3 may be the same as or different from each other, they are preferably the same.

The thicknesses of the first sheet 2 and the second sheet 3 are not particularly limited but may be preferably 10 μm to 200 μm, and more preferably 30 μm to 100 μm. They may be, for example, preferably 40 μm to 60 μm. The thicknesses of the first sheet 2 and the second sheet 3 may be the same as or different from each other. The thickness of each of the first sheet 2 and the second sheet 3 may be uniform as a whole or may be partially small. In the embodiment, the thicknesses of the first sheet 2 and the second sheet 3 are preferably the same. The thicknesses of each of the first sheet 2 and the second sheet 3 are preferably uniform as a whole.

The first sheet 2 and the second sheet 3 are joined to each other at the outer edge portions thereof. A method of joining them is not particularly limited, but for example, laser welding, resistance welding, diffusion bonding, brazing, TIG welding (tungsten-inert gas welding), ultrasonic bonding, or resin sealing can be used and the laser welding, the resistance welding, or the brazing can be preferably used.

The first pillars 9 are provided between the first sheet 2 and the second sheet 3. The plurality of first pillars 9 are provided on the main surface of the first sheet 2 on the internal space 5 side. The first pillars 9 support the first sheet 2 and the second sheet 3 from the inside such that a distance between the first sheet 2 and the second sheet 3 is a predetermined distance. That is, the first pillars 9 function as columns for supporting the first sheet 2 and the second sheet 3 of the vapor chamber. By arranging the first pillars 9 inside the housing 4, deformation of the housing can be suppressed when the inside of the housing is depressurized, when external pressure is applied from the outside of the housing, and the like.

The second pillars 10 are provided between the first sheet 2 and the second sheet 3. The second sheet 3 has the plurality of second pillars 10 on the main surface thereof on the internal space 5 side. Since the second sheet 3 has the plurality of second pillars 10, the working medium can be held between the second pillars, so that the amount of the working medium in the vapor chamber of the invention can be easily increased. By increasing the amount of the working medium, the heat transportation capacity of the vapor chamber is improved. Here, the second pillars refer to relatively higher portions than the surroundings and also include relatively higher portions with recess portions formed in the main surface, for example, grooves or the like in addition to portions protruding from the main surface, for example, columnar portions and the like.

In the vapor chamber that is used in the invention, the second pillars 10 are not essential components and may be omitted. The second pillars 10 are not necessarily formed only in the second sheet 3, and may be formed in either one of the first sheet 2 or the second sheet 3 or both of them.

The heights of the first pillars 9 are larger than the heights of the second pillars 10. In one mode, the heights of the first pillars 9 may be preferably 1.5 times to 100 times, more preferably 2 times to 50 times, much more preferably 3 times to 20 times, and still more preferably 3 times to 10 times larger than the height of the second pillars 10.

The shapes of the first pillars 9 are not particularly limited as long as the first pillars 9 can support the first sheet 2 and the second sheet 3 but are preferably columnar shapes. The shapes thereof may be, for example, cylindrical shapes, prismatic shapes, truncated cone shapes, truncated pyramid shapes, or the like.

A material forming the first pillars 9 is not particularly limited but is, for example, metal. The material may be, for example, copper, nickel, aluminum, magnesium, titanium, iron, an alloy containing any of them as a main component thereof, or the like and be particularly preferably copper. In a preferred mode, the material forming the first pillars 9 is the same material as either of the first sheet 2 or the second sheet 3 or both of them.

The heights of the first pillars 9 can be appropriately set in accordance with a desired thickness of the vapor chamber and are preferably 50 µm to 500 µm, more preferably 100 µm to 400 µm, and still more preferably 100 µm to 200 µm. The heights thereof are, for example, 125 µm to 150 µm. Here, the heights of the first pillars indicate the heights thereof in the thickness direction of the vapor chamber.

The heights of the first pillars 9 may be the same as or different from each other in one vapor chamber. For example, the height of the first pillar 9 in a certain region and the height of the first pillar 9 in another region may be different from each other. By varying the heights of some first pillars, the thickness of the vapor chamber can be partially varied.

The thicknesses of the first pillars 9 are not particularly limited as long as the first pillars 9 give strength capable of suppressing deformation of the housing of the vapor chamber. For example, circle-equivalent diameters of cross sections of the first pillars 9, which are perpendicular to the height direction, may be 100 µm to 2000 µm, and preferably 300 µm to 1000 µm. By increasing the circle-equivalent diameters of the first pillars, it is possible to further suppress the deformation of the housing of the vapor chamber. Further, by decreasing the circle-equivalent diameters of the first pillars, it is possible to ensure a wider space for movement of the vapor of the working medium.

The arrangement of the first pillars 9 is not particularly limited, but the first pillars 9 are arranged preferably uniformly in a predetermined region, and more preferably uniformly as a whole. The first pillars 9 are arranged, for example, in a grid form such that distances between the first pillars 9 are constant. By uniformly arranging the first pillars, uniform strength can be ensured throughout the vapor chamber.

The number and intervals of the first pillars 9 are not particularly limited, but the number thereof may be preferably 0.125 to 0.5, and more preferably 0.2 to 0.3 per 1 mm$^2$ of the area of the main surface of one sheet defining the internal space of the vapor chamber. Increase in the number of the first pillars can further suppress the deformation of the vapor chamber (or the housing). Decrease in the number of the first pillars can ensure a wider space for movement of the vapor of the working medium.

The first pillars 9 may be formed integrally with the first sheet 2 or the second sheet 3 or may be fixed at predetermined positions after they are manufactured separately from the first sheet 2 or the second sheet 3.

The heights of the second pillars 10 are not particularly limited but may be preferably 1 µm to 100 µm, more preferably 5 µm to 50 µm, and still more preferably 15 µm to 30 µm. Increase in the heights of the second pillars can increase the holding amount of the working medium. Decrease in the heights of the second pillars can ensure a wider space for movement of the vapor of the working medium (space on the side of the first pillars). Accordingly, by adjusting the heights of the second pillars, it is possible to adjust the heat transportation capacity of the vapor chamber.

The distances between the second pillars 10 are not particularly limited but may be preferably 1 µm to 500 µm, more preferably 5 µm to 300 µm, and still more preferably 15 µm to 150 µm. Decrease in the distances between the second pillars can increase the capillary force. Increase in the distances between the second pillars can increase transmittance.

The shapes of the second pillars 10 are not particularly limited but may be cylindrical shapes, prismatic shapes, truncated cone shapes, truncated pyramid shapes, or the like. The shapes of the second pillars 10 may be wall shapes, that is, such shapes that grooves are formed between the second pillars 10 adjacent to each other.

The second pillars 10 may be formed integrally with the first sheet 2 or the second sheet 3 or may be fixed at predetermined positions after they are manufactured separately from the first sheet 2 or the second sheet 3.

The wick 6 is composed of the first mesh 7 and the second mesh 8. The term "mesh" as used herein means a sheet having a network structure. Here, the term "network structure" means a structure in which a plurality of points is connected by a plurality of line segments. In one mode, the network structure may be a fibrous structure. The fibrous structure indicates a structure composed of a plurality of fibers and includes, for example, a structure in which fibers are woven, a structure in which fibers are irregularly entangled, and the like. In a preferred mode, the first mesh 7 and the second mesh 8 have structures in which warp yarns and weft yarns are knitted. The diameters of the warp yarns and the weft yarns are not particularly limited. In addition, when equal to or more than two meshes are used, the mesh directions thereof are not particularly limited and may be the same as or different from each other. In the embodiment, the two meshes are used. The number of meshes is not however limited thereto and a plurality of meshes, for example, three, four, five, or more than five meshes may be used.

The thicknesses of the first mesh 7 and the second mesh 8 are not particularly limited but may be, for example, 5 μm to 200 μm, preferably 10 μm to 80 μm, and more preferably 30 μm to 50 μm.

In the invention, the wick is not particularly limited as long as it has a structure in which the thickness thereof is partially different along a cross-section thereof and the working medium can be moved by the capillary force. For example, the wick may be a wick having a well-known capillary structure used in an existing vapor chamber. For example, the wick may be a wick having a micro structure having irregularities such as pores, grooves, and protrusions.

The size and shape of the wick 6 are not particularly limited, but the wick 6 preferably has such size and shape that it can be continuously installed from an evaporation portion to a condensation portion inside the housing. In particular, the wick preferably has such size and shape that the thin portion thereof can be present to the vicinity of the outer edge portion of the housing.

The thickness of the wick 6 is not particularly limited but may be, for example, 5 μm to 400 μm, preferably 10 μm to 150 μm, and more preferably 30 μm to 100 μm.

The working medium is not particularly limited as long as it can undergo gas-liquid phase change under an environment in the housing. For example, water, alcohol, substitute freon, or the like can be used therefor. In one mode, the working medium is aqueous compound and is preferably water.

While the vapor chamber 1a in one embodiment of the invention has been described above, the invention is not limited to the embodiment. Hereinafter, other embodiments will be described.

Second Embodiment

Figure 3:
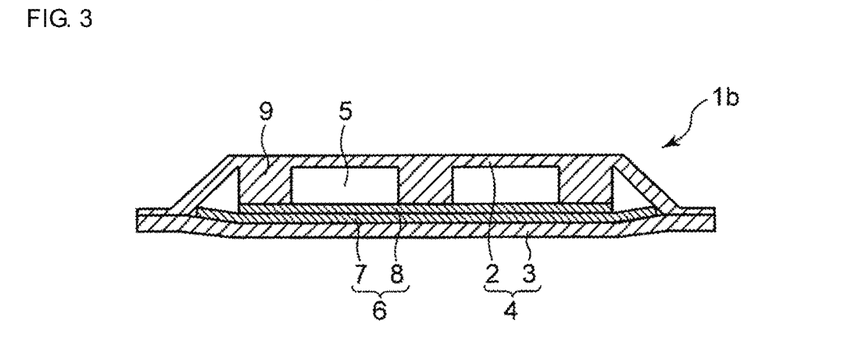
FIG. 3 is a cross-sectional view of a vapor chamber 1b in another embodiment of the invention taken along line A-A.

FIG. 3 is a cross-sectional view of a vapor chamber 1b taken along line A-A in the embodiment. The vapor chamber 1b has the same configuration as the above-described vapor chamber 1a except that no second pillar 10 is provided. That is, a plan view of the vapor chamber 1b is as illustrated in FIG. 1.

As described above, the vapor chamber 1b in the embodiment includes no second pillar. That is, the wick 6 is brought into direct contact with the second sheet 3. Since the vapor chamber 1b includes no second pillar, the thickness of the vapor chamber 1b can be reduced by the height of the second pillars. In addition, when the thickness of the vapor chamber 1b is not reduced, the internal space 5, particularly a space between the wick 6 and the first sheet 2, can be ensured to be large, and the vapor passage becomes large. Therefore, the heat transportation amount of the vapor chamber can be further increased.

Third Embodiment

Figure 4:
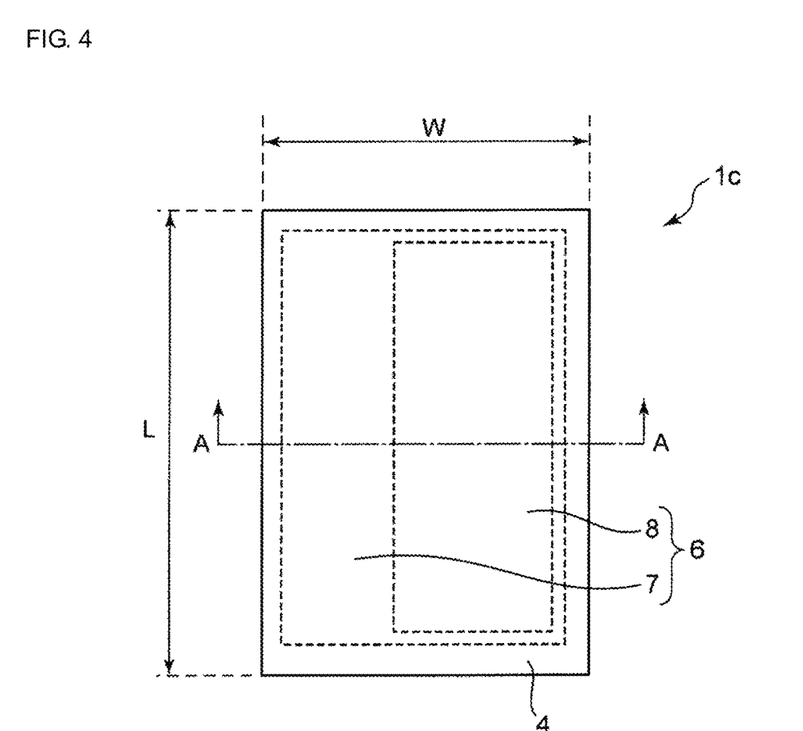
FIG. 4 is a plan view of a vapor chamber 1c in another embodiment of the invention.
Figure 5:
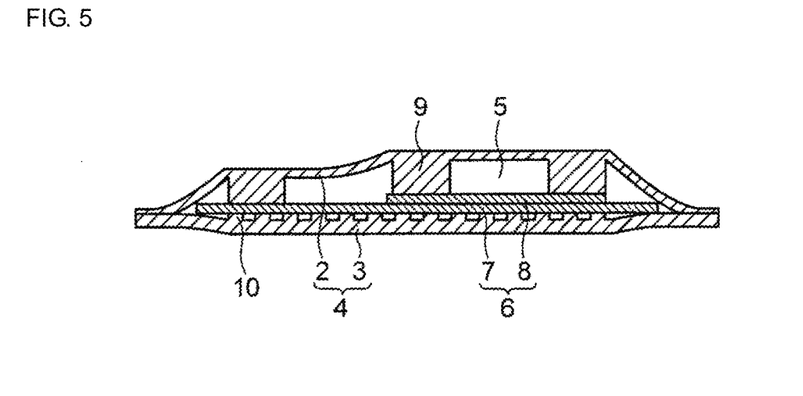
FIG. 5 is a cross-sectional view of the vapor chamber 1c illustrated in FIG. 4 taken along line A-A.

FIG. 4 is a plan view of a vapor chamber 1c of the third embodiment and FIG. 5 is a cross-sectional view thereof taken along line A-A.

As illustrated in FIGS. 4 and 5, in the vapor chamber 1c, the second mesh is provided while being biased toward one side of the housing 4 (biased toward the right side in the drawings). Some of the first pillars 9 are brought into contact with and support the second mesh 8 in a region where the first mesh 7 and the second mesh 8 overlap with each other. On the other hand, the others of the first pillars 9 are provided in a region with no second mesh 8 and are brought into direct contact with and support the first mesh 7. In the portion where the first pillars 9 are brought into direct contact with the first mesh 7, the thickness of the vapor chamber 1c is also reduced by the thickness of the second mesh 8. The vapor chamber 1c in the embodiment is similar to that of the vapor chamber 1a in configurations other than the above-described ones.

Since the vapor chamber 1c has the portion with a small thickness, interference with other components is suppressed when the vapor chamber 1c is mounted on an electronic apparatus. In addition, in the portion where the two of the first mesh 7 and the second mesh 8 overlap with each other, it is possible to ensure transportation capacity for the liquid working medium. Therefore, the vapor chamber 1c in the embodiment has an advantage that it is less likely to interfere with other components in mounting on the electronic apparatus or the like while ensuring high heat transportation capacity.

Fourth Embodiment

Figure 6:
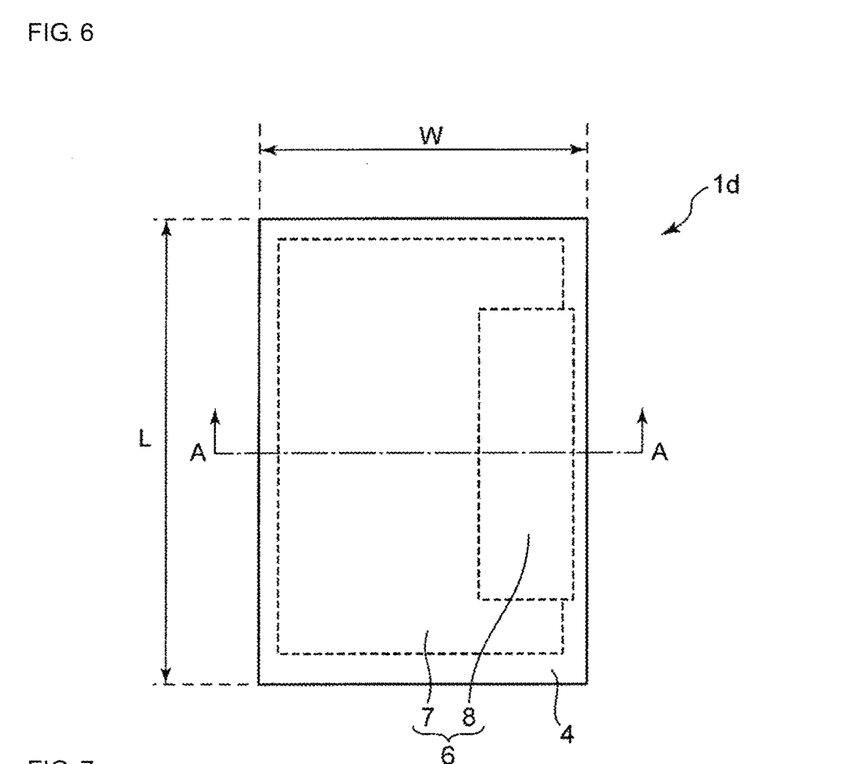
FIG. 6 is a plan view of a vapor chamber 1d in another embodiment of the invention.
Figure 7:
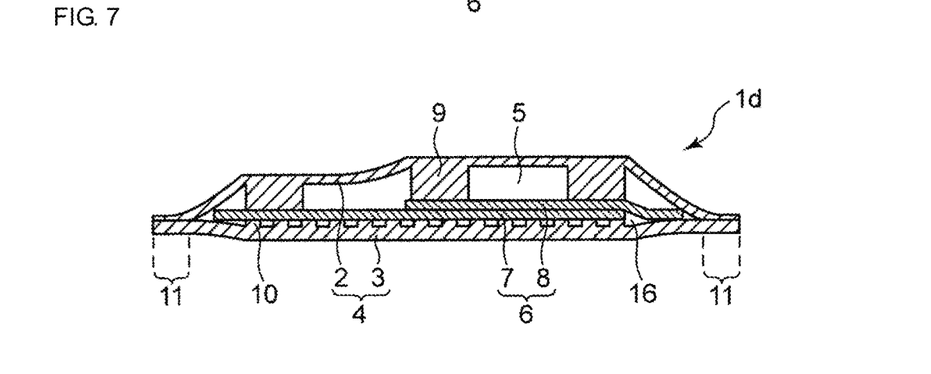
FIG. 7 is a cross-sectional view of the vapor chamber 1d illustrated in FIG. 6 taken along line A-A.

FIG. 6 is a plan view of a vapor chamber 1d in the embodiment and FIG. 7 is a cross-sectional view thereof taken along line A-A. The vapor chamber 1b has the same configuration as the above-described vapor chamber 1c except for arrangement of the first mesh 7 and the second mesh 8 in the vicinity of an outer edge portion.

As illustrated in FIGS. 6 and 7, in the vapor chamber 1d in the embodiment, the first mesh 7 is spaced apart from the outer edge portion and the second mesh 8 on the first mesh 7 extends to the vicinity of the outer edge portion beyond the edge of the first mesh 7. That is, the second mesh 8 extends to a portion closer to the outer edge portion than the first mesh 7. A space 16 may be formed in a place where the second mesh 8 extends beyond the edge of the first mesh 7. The height of the space 16 is equal to the thickness of the first mesh 7.

Since the space 16 is a relatively narrow space, capillary force may be generated therein. Accordingly, the space 16 may have transportation capacity for a liquid working medium. Since the vapor chamber 1d has the portion with a small thickness as in the vapor chamber 1c, interference with other components is suppressed when the vapor chamber 1d is mounted on an electronic apparatus. Therefore, the vapor chamber 1d in the embodiment has an advantage that it is less likely to interfere with other components in mounting on the electronic apparatus or the like while ensuring high heat transportation capacity.

In the embodiment, the wick 6 is composed of the two meshes. The invention is not however limited thereto and the wick 6 may be composed of a plurality of meshes, for example, equal to or more than three meshes. In this case, when the mesh of an upper layer among the plurality of meshes extends to a portion closer to the outer edge portion than the mesh of a lower layer, the above effect can be obtained.

Fifth Embodiment

Figure 8:
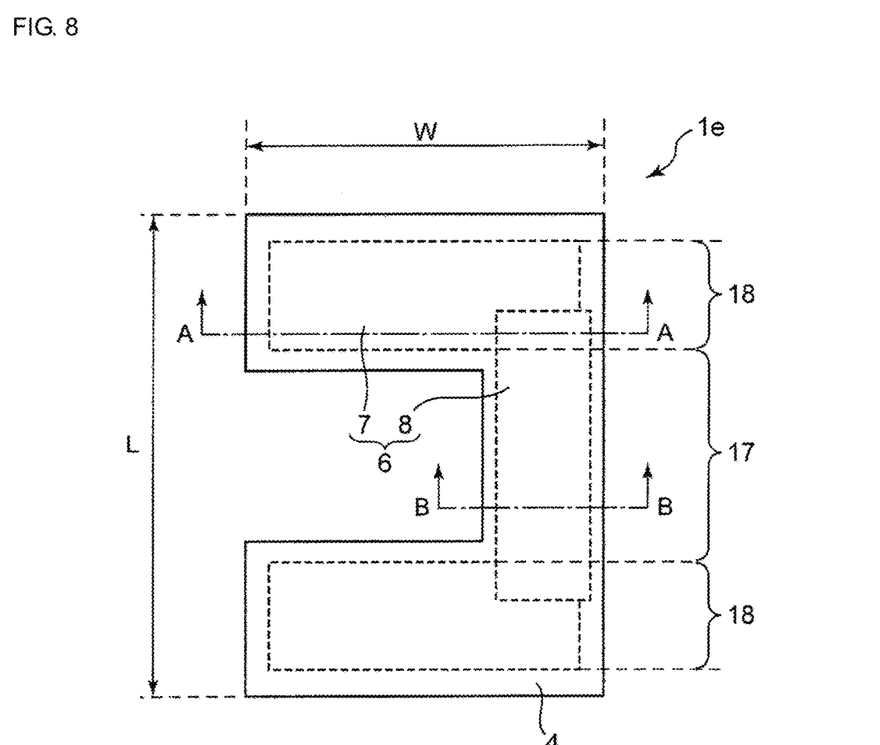
FIG. 8 is a plan view of a vapor chamber 1e in another embodiment of the invention.
Figure 9:
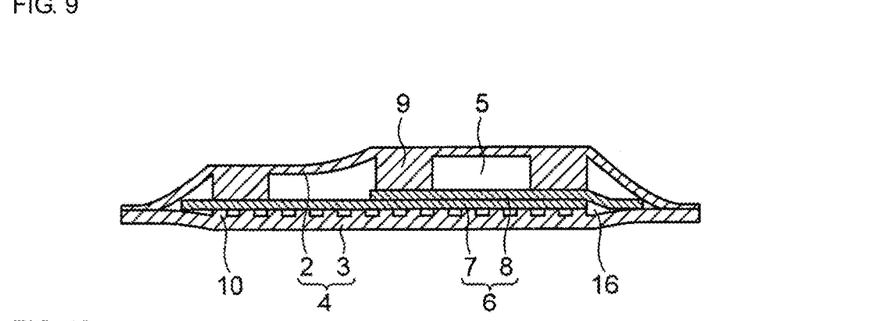
FIG. 9 is a cross-sectional view of the vapor chamber 1e illustrated in FIG. 8 taken along line A-A.
Figure 10:
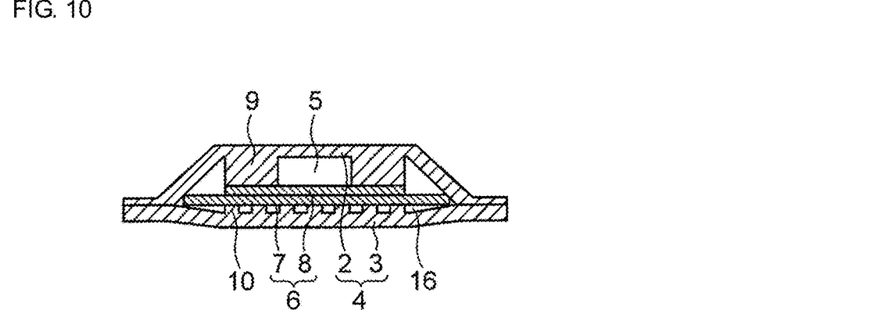
FIG. 10 is a cross-sectional view of the vapor chamber 1e illustrated in FIG. 8 taken along line B-B.

FIG. 8 is a plan view of a vapor chamber 1e in the embodiment, FIG. 9 is a cross-sectional view thereof taken along line A-A, and FIG. 10 is a cross-sectional view thereof taken along line B-B.

As illustrated in FIGS. 8, 9 and 10, the vapor chamber 1e has a U shape in plan view. The internal space 5 of the vapor chamber 1e also has a U shape in plan view in a similar manner. That is, the internal space of the vapor chamber 1e in the embodiment has a narrow portion 17 and wide portions 18 located at both ends of the narrow portion 17 in plan view.

The "narrow portion" of the internal space means a portion of the internal space, which has a relatively small cross-sectional area, when cross sections parallel to each other are acquired in the same direction (typically, the length (L in FIG. 8) direction or the width (W in FIG. 8) direction) in the internal space. In the embodiment, when cross sections parallel to the cross section taken along A-A are acquired in the length (L) direction, a region indicated by a reference numeral 17 has a cross-sectional area, which is smaller than those of the other regions (referred to as the "wide regions") 18. Accordingly, the region 17 is the narrow portion.

The narrow portion is not particularly limited as long as it has a cross-sectional area smaller than those of the wide portions as described above, but the cross-sectional area of the narrow portion may be preferably equal to or less than 90%, more preferably equal to or less than 70%, and still more preferably equal to or less than 50% of the cross-sectional areas of the wide portions. The cross-sectional area of the narrow portion may be, for example, equal to or less than 40%, equal to or less than 30%, or equal to or less than 20% of the cross-sectional areas of the wide portions.

In the narrow portion 17, the wick 6 is composed of two meshes (i.e., the first mesh 7 and the second mesh 8) overlapped with each other. In the narrow portion 17, the wick 6 has a large thickness. Since the narrow portion 17 has a smaller cross-sectional area than those of the wide portions 18, pressure loss in capillary force is generated in transportation of a working medium in the length (L) direction. However, as in the embodiment, by using the wick 6 formed by overlapping the (equal to or more than) two meshes to ensure the thickness, the pressure loss in the capillary force in the narrow portion can be compensated and transportation capacity for the working medium can be increased. Therefore, according to the embodiment, even when the narrow portion is present, high heat transportation capacity can be ensured.

The portion where the first mesh 7 and the second mesh 8 overlap with each other is not limited to the narrow portion 17 only and may extend partially to the wide portions 18 as illustrated in the drawings.

Sixth Embodiment

Figure 11:
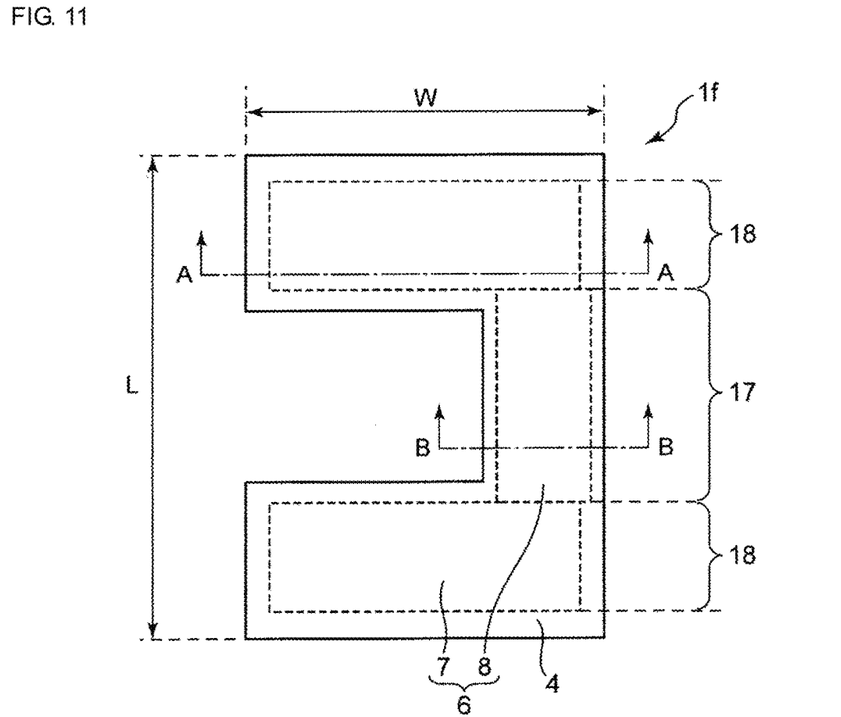
FIG. 11 is a plan view of a vapor chamber 1f in another embodiment of the invention.
Figure 12:
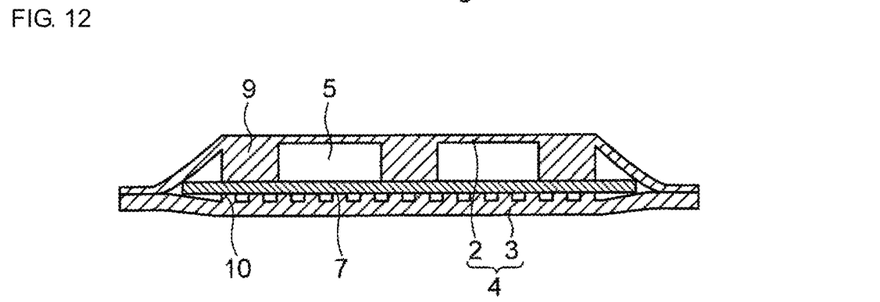
FIG. 12 is a cross-sectional view of the vapor chamber 1f illustrated in FIG. 11 taken along line A-A.
Figure 13:
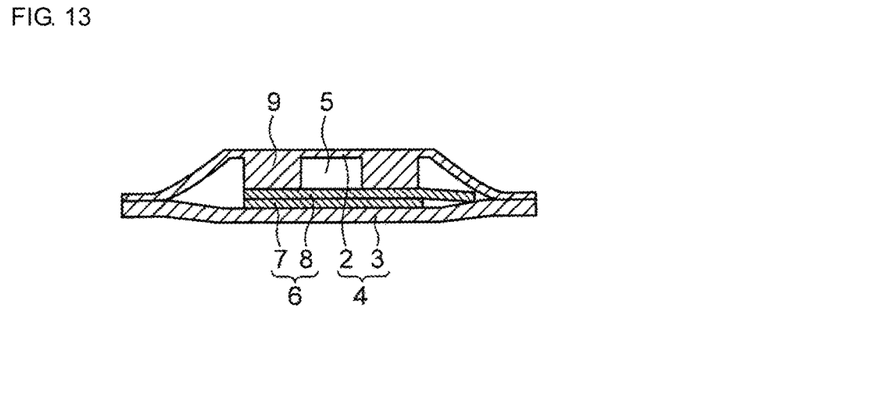
FIG. 13 is a cross-sectional view of the vapor chamber 1f illustrated in FIG. 11 taken along line B-B.

FIG. 11 is a plan view of a vapor chamber 1f in the embodiment, FIG. 12 is a cross-sectional view thereof taken along line A-A, and FIG. 13 is a cross-sectional view thereof taken along line B-B.

As illustrated in FIGS. 11, 12, and 13, the vapor chamber 1f has no second pillar in the narrow portion 17. In the wide portions 18, the wick 6 is composed of the first mesh 7. The vapor chamber 1f is similar to the above-described vapor chamber 1e except for the above-described configurations.

Similarly to the vapor chamber 1e, since the wick 6 formed by overlapping the first mesh 7 and the second mesh 8 is used in the narrow portion 17, pressure loss in capillary force in the narrow portion can be compensated and transportation capacity for a working medium can be enhanced. Further, since no second pillar is provided in the narrow portion 17, a large space between the wick 6 and the first sheet 2 can be ensured by the height of the second pillars, i.e., a large vapor passage can be ensured. Therefore, the vapor chamber 1f has excellent heat transportation capacity even though it has the narrow portion 17.

Seventh Embodiment

Figure 14:
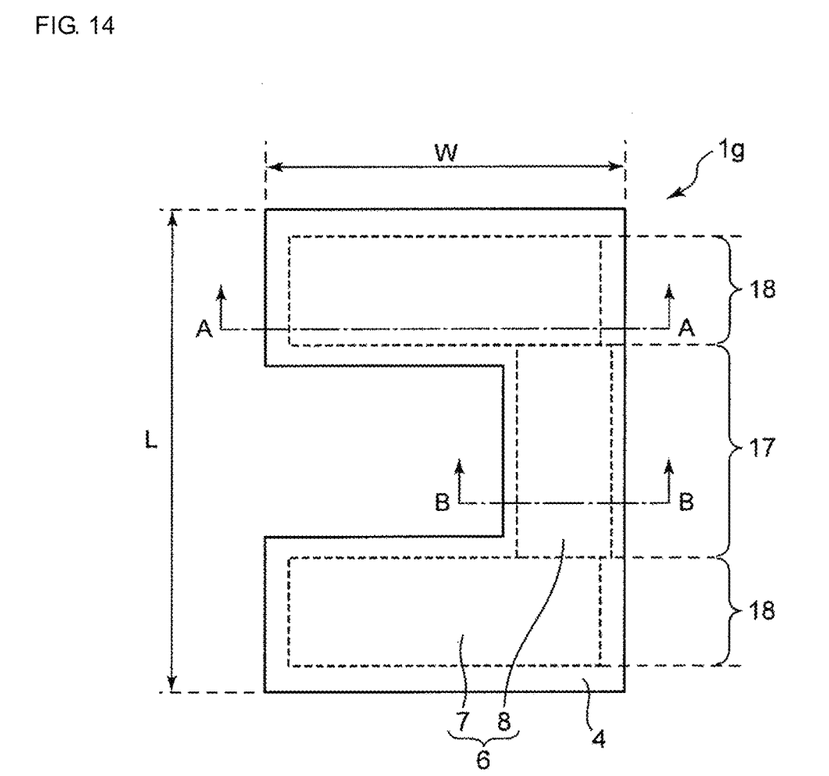
FIG. 14 is a plan view of a vapor chamber 1g in another embodiment of the invention.
Figure 15:
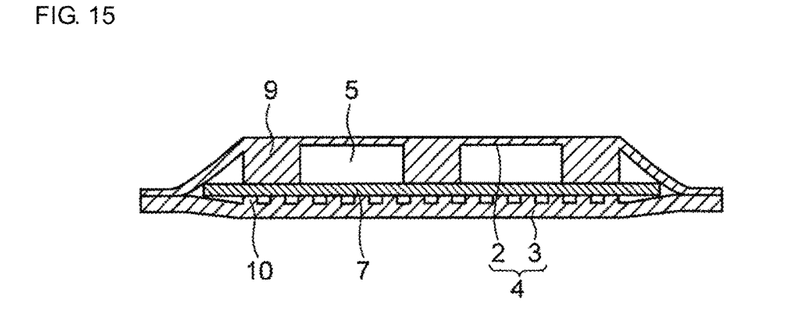
FIG. 15 is a cross-sectional view of the vapor chamber 1g illustrated in FIG. 14 taken along line A-A.
Figures 16A, 16B:
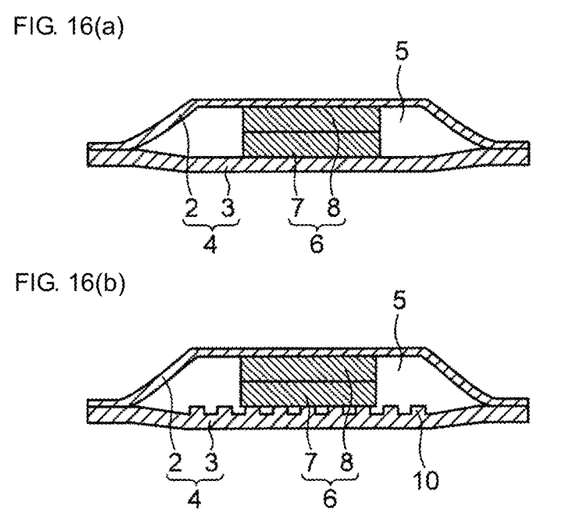
FIG. 16(a) and FIG. 16(b) are cross-sectional views of the vapor chamber 1g illustrated in FIG. 14 taken along line B-B.

FIG. 14 is a plan view of a vapor chamber 1g in the embodiment, FIG. 15 is a cross-sectional view thereof taken along line A-A, and FIGS. 16(a) and 16(b) are cross-sectional views thereof taken along line B-B.

As illustrated in FIGS. 14, 15 and 16(a) and 16(b), the vapor chamber 1g is similar to the above-described vapor chamber 1f except for the narrow portion 17. In one mode, as illustrated in FIG. 16(a), no first pillar and no second pillar are provided in the narrow portion 17. In another mode, as illustrated in FIG. 16(b), the second pillars 10 are provided but no first pillar is provided in the narrow portion 17. In the narrow portion 17 of the vapor chamber 1g, the first mesh 7 and the second mesh 8 are arranged so as to overlap with each other, the second mesh 8 is brought into contact with the first sheet 2, and the first mesh 7 is brought into contact with the second sheet 3 in the mode illustrated in FIG. 16(a) or is brought into contact with the second pillars 10 in the mode illustrated in FIG. 16(b) to support the housing 4. As a result, the internal space 5 of the narrow portion 17 is formed.

Since the wick 6 formed by overlapping the first mesh 7 and the second mesh 8 is used in the narrow portion 17, pressure loss in capillary force in the narrow portion can be compensated and transportation capacity for a working medium can be increased. In addition, although no first pillar is provided, the wick 6 supports the housing and the internal space 5 can also be ensured. Further, since no first pillar is provided, the thickness of the housing can be reduced by the height of the first pillars. Alternatively, when the thickness of the housing is not reduced, the thickness of the wick can be increased.

Eighth Embodiment

Figure 17:
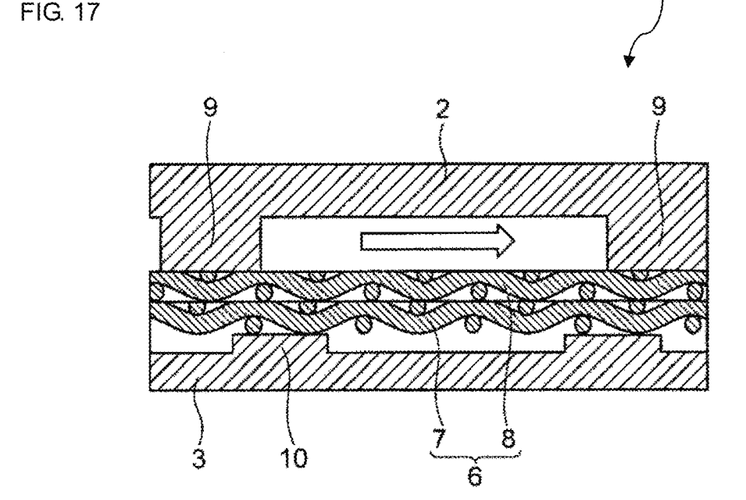
FIG. 17 is a partial cross-sectional view illustrating a wick structure of a vapor chamber in another embodiment of the invention.

FIG. 17 is a cross-sectional view illustrating the wick 6 that is used for a vapor chamber 1h in the embodiment and the periphery thereof.

The vapor chamber 1h is characterized by the wick 6. The wick 6 in the embodiment is composed of the first mesh 7 and the second mesh 8. The first mesh 7 and the second mesh 8 have structures in which warp yarns and weft yarns are knitted. The first mesh 7 and the second mesh 8 have flat upper surfaces (surfaces on the first sheet 2 side). Here, the term "flat" does not mean a perfect flat shape but means a state in which the warp yarns and the weft yarns constituting the upper surface of the mesh are crushed, as illustrated in FIG. 17. Typically, when the upper surface of the mesh is flat, the upper surface has surface roughness (Ra) of equal to or less than 10 μm. The diameters of the warp yarns and the weft yarns are not particularly limited. The mesh directions of the two meshes may be the same as or different from each other.

By flattening the upper surfaces of the meshes as described above, that is, by flattening a surface of the wick 6 that communicates with a vapor passage, friction when a gas working medium moves on the wick 6 is reduced and heat transportation capacity is improved.

Although the vapor chambers 1a to 1h have been described above, the invention is not limited to the above-described vapor chambers 1a to 1h and design thereof can be modified without departing from the gist of the invention.

For example, although the planar shape (i.e., the planar shape of the housing 4) of the vapor chamber of the invention is the rectangular shape or the U shape in each of the above embodiments, it is not limited thereto. For example, the planar shape of the above-described vapor chamber may be a polygonal shape such as a triangle and a rectangle, a circle, an ellipse, a combination thereof, or the like. In addition, the planar shape of the vapor chamber of the invention may have a through-hole therein. The planar shape of the vapor chamber of the invention may have a shape corresponding to an intended use, a shape of a place where the vapor chamber is incorporated, or a shape corresponding to another component existing in the vicinity thereof.

The thick portion of the wick is not limited to the above embodiments and may be an arbitrary portion.

The vapor chamber of the invention can be suitably used for electronic apparatuses having various internal shapes.

REFERENCE SIGNS LIST 1a to 1g VAPOR CHAMBER
2 FIRST SHEET
3 SECOND SHEET
4 HOUSING
5 INTERNAL SPACE
6 WICK
7 FIRST MESH
8 SECOND MESH
9 FIRST PILLAR
10 SECOND PILLAR
11 JOINT PORTION
16 SPACE
17 NARROW PORTION
18 WIDE PORTION
101 VAPOR CHAMBER
102 PENETRATION PORTION
103 CUTOUT PORTION

The invention claimed is:

1. A vapor chamber comprising:
a housing defining an internal space;
a first pillar arranged in the internal space of the housing to support the housing from the internal space;
a working medium enclosed in the internal space of the housing; and
a wick arranged in the internal space of the housing, the wick having a portion of a first main surface thereof supported by the first pillar so as to be spaced from the housing, and a thickness of the wick is partially different along a cross-section thereof,
wherein the wick comprises a plurality of mesh layers, and the plurality of mesh layers overlap with each other in at least a part of the wick, and
wherein a first portion of the wick along a first part of the outer edge portions contains only a first mesh layer of the plurality of mesh layers, and a second portion of the wick along a second part of the outer edge portions contains only a second mesh layer of the plurality of mesh layers.

2. The vapor chamber according to claim 1, wherein the plurality of mesh layers are only two mesh layers.

3. The vapor chamber according to claim 2, wherein the housing comprises first and second sheets that face each other, outer edge portions of the first and second sheets are sealed to each other, and a portion of the wick along the outer edge portions contains one mesh layer of the two mesh layers.

4. The vapor chamber according to claim 1, further comprising a second pillar arranged in the internal space of the housing, the second pillar supporting a second main surface of the wick opposite the first main surface.

5. The vapor chamber according to claim 4, wherein a height of the second pillar is less than a height of the first pillar.

6. The vapor chamber according to claim 1, wherein the internal space has a first portion and a second portion, the first portion being narrower than the second portion.

7. The vapor chamber according to claim 4, wherein the internal space has a first portion and a second portion, the first portion being narrower than the second portion, the second portion having the first pillar and the second pillar therein, and the first portion having only the first pillar among the first pillar and the second pillar therein.

8. The vapor chamber according to claim 4, wherein the internal space has a first portion and a second portion, the first portion being narrower than the second portion, the first portion having only the second pillar among the first pillar and the second pillar therein.

9. The vapor chamber according to claim 4, wherein a thickness of the wick is largest in the first portion.

10. The vapor chamber according to claim 1, wherein a thickness of the of the internal space of the vapor chamber is smallest in at least a part thereof corresponding to a smallest thickness portion of the wick.

11. The vapor chamber according to claim 1, wherein a surface of the plurality of mesh layers that communicate with a vapor passage of the vapor chamber are flat.

12. The vapor chamber according to claim 11, wherein the plurality of mesh payers have structures in which warp yarns and weft yarns are knitted.

13. The vapor chamber according to claim 11, wherein the wick has a structure in which warp yarns and weft yarns are knitted.

14. The vapor chamber according to claim 1, wherein the vapor chamber has a U shape in a plan view thereof.

15. An electronic apparatus comprising the vapor chamber according to claim 1.

* * * * *